(12) United States Patent
Ashar et al.

(10) Patent No.: US 6,662,323 B1
(45) Date of Patent: Dec. 9, 2003

(54) FAST ERROR DIAGNOSIS FOR COMBINATIONAL VERIFICATION

(75) Inventors: Pranav Ashar, Belle Mead, NJ (US); Aarti Gupta, Princeton, NJ (US)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/425,886

(22) Filed: Oct. 25, 1999

Related U.S. Application Data

(60) Provisional application No. 60/142,537, filed on Jul. 7, 1999.

(51) Int. Cl.[7] .................. G01R 31/28; G01R 31/02; G06F 17/50
(52) U.S. Cl. ............... 714/724; 714/5; 324/528; 324/759
(58) Field of Search ............... 716/1–6; 710/1; 714/724; 324/528, 759

(56) References Cited

U.S. PATENT DOCUMENTS

| | | | | |
|---|---|---|---|---|
| 5,506,852 A | * | 4/1996 | Chakradhar et al. | 714/725 |
| 5,754,454 A | * | 5/1998 | Pixley et al. | 702/123 |
| 5,831,996 A | * | 11/1998 | Abramovici et al. | 714/738 |
| 5,909,374 A | * | 6/1999 | Matsunaga | 716/18 |
| 6,026,222 A | * | 2/2000 | Gupta et al. | 716/5 |
| 6,086,626 A | * | 7/2000 | Jain et al. | 716/2 |
| 6,138,266 A | * | 10/2000 | Ganesan et al. | 716/1 |
| 6,247,163 B1 | * | 6/2001 | Burch et al. | 716/3 |

OTHER PUBLICATIONS

Abadir, M., Ferguson, J., Kirkland, Thomas E. "Logic Design Verification via Test Generation"; IEEE Translations on Computer Aided Design, vol. 7 No. 1, pp. 138–148, Jan. 1988.

Brand, Daniel, "Verification of Synthesized Circuits", Proceedings of ICCAD, pp. 534–537 1993.

Bryant, R., Graph–Based Algorithms for Boolean Function Manipulation, IEEE Translations On Computer, C–35(8):677–691, Aug. 1996.

Chung, P., Wang, Y. and Hajj, I., "Diagnosis and Correction of Logic Design in Digital Circuits", Proceedings of DAC, pp. 503–508, 1993.

Jain, J., Mukherjee, R., Fujita, M.; "Advanced Verification Techniques Based on Learning" Proceedings of DAC, Jun. 1995.

Kuehlmann, A.; Cheng, D.; Srinivasan, A.; Lapotin, D.; "Error Diagnosis for Transistor–Level Verification", Proceedings of DAC, pp. 218–223, 1994.

Kukimoto, Y.; Fujita, M.; Rectification Method for Look-up–Table Type FPGA's Proceedings of ICCAD, pp. 54–61 1992.

(List continued on next page.)

Primary Examiner—Albert Decady
Assistant Examiner—Anthony T. Whittington
(74) Attorney, Agent, or Firm—Sughrue Mion PLLC

(57) ABSTRACT

A fast error diagnosis system and process for combinational verification is described. The system and process localizes error sites in a combinational circuit implementation that has been shown to be inequivalent to its specification. In the typical case, it is not possible to identify the error location exactly. The invention uses a diagnosis strategy of gradually increasing the level of detail in the analysis algorithm to ultimately derive a small list of potential error sites in a short time. The invention combines the use of simulation, Binary Decision Diagrams, and Boolean satisfiability in a novel way to achieve the goal. The previous approaches have been limited in that they have either been constrained to a specific error model unlike the present invention, or they are inefficient in comparison to the present invention. The present invention allows for the final set of error sites derived to be small, where that set contains the actual error sites, and is derived in a reasonable amount of time.

7 Claims, 3 Drawing Sheets

OTHER PUBLICATIONS

Madre, J.; Coudert, O. and Billon, P., "Automating the Diagnosis and the Retification of Design Errors with PRIAM", Proceedings of ICCAD, pp. 30–33, 1989.

Reddy, S.; Kunz, W.; Pradhan, D., "Novel Verification Framework Combining Structural and OBDD Methods in a Synthesis Environment", Proceedings of DAC, pp. 414–419, 1995.

Silva, J.; Sakallah, K., Grasp—A New Search Algorithm for Satisfiability. Proceedings of ICCAD, pp. 220–227, 1996.

Tamura, K., "Locating Functional Errors in Logic Circuits" Proceedings of ICCAD, pp. 468–471, Nov. 1989.

Tomita, M.; Jiang, H., Yamamoto, T. and Hayashi, Y, "An Algorithm for Locating Logic Design Errors", ICCAD, pp. 468–471, Nov. 1990.

Watanabe, Y., Brayton, R., "Incremental Synthesis for Engineering Changes", Proceedings of ICCD, pp. 40–43, 1991.

Haung, S., Chen, K–C, Cheng, K–T, "Error Correction Based on Verification Techniques", Proceedings of DAC pp. 258–261, 1996.

Sentovich, E., et. al., "Sequential Circuit Design Using Synthesis and Optimization", Proceedings of ICCD, 1992.

Gupta, A., Ashar, P., Integrating a Boolean Satisfiability and BDDS for Combinational Verification, Proceedings of VLSI Design 98, pp. 222–225, 1998.

Burch, J. and Singhai, V., Tight Integration of Combinational Verification Methods, Proceedings of ICCAD, pp. 570–576, 1998.

M. Tomita, N. Suganuma and K. Hirano, "Pattern generation for locating logic design errors", IEICE Transactions Fundamentals, vol. E77–A, 1994.

* cited by examiner

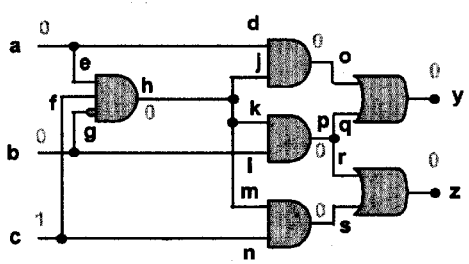
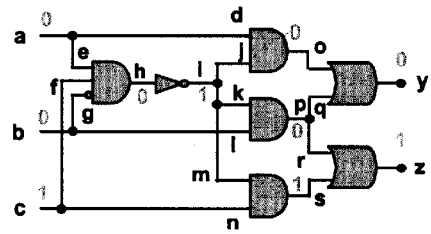
Fig. 1
Fig. 2
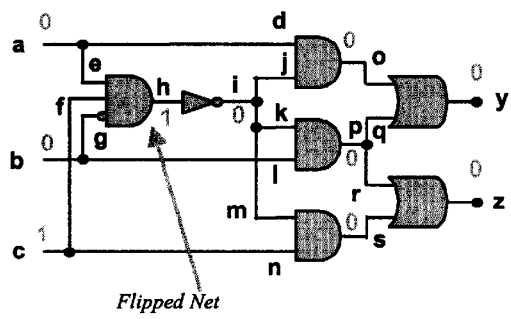
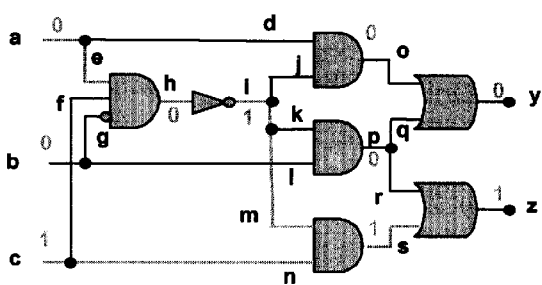
Fig. 3
Fig. 4
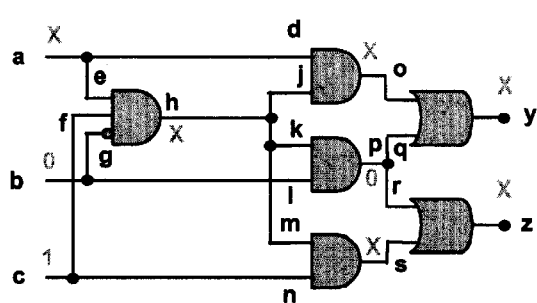
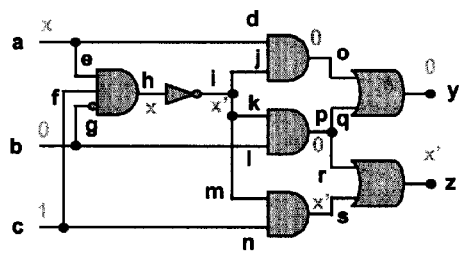
Fig. 5
Fig. 6

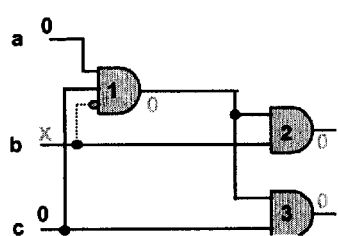
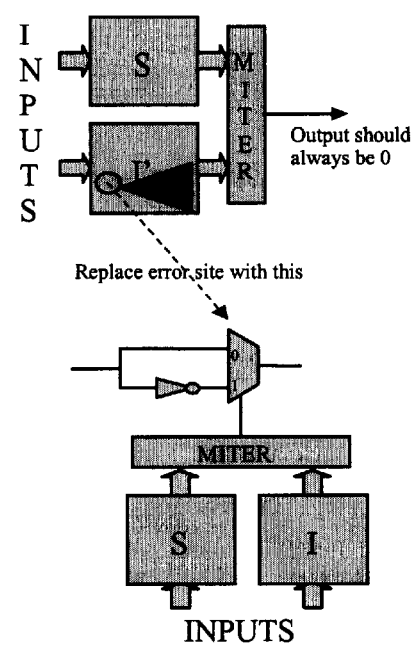
Fig. 7
Fig. 8

FAST ERROR DIAGNOSIS FOR COMBINATIONAL VERIFICATION

This Application claims priority from a co-pending U.S. Provisional Application Serial No. 60/142,537, filed Jul. 7, 1999.

BACKGROUND OF THE INVENTION

1. Field of the Invention

The present invention relates generally to the process of determining faults in a circuit. More specifically, the diagnosis method is used to determine error sites in a combinational circuit that has been determined to be inequivalent to its specification.

2. Description of the Related Art

The need for design validation and early detection of errors is well recognized. Formal methods for combinational verification have gained wide acceptance in the digital hardware design community in the recent past. In fact, it appears that tools based on these techniques have captured significant market share from gate-level simulation tools. Arising out of this phenomenon is the opportunity to promote the use of automatic error diagnosis tools. Automatic error diagnosis is even more important in the context of automatic verification since, unlike in the case of the simulation of manually generated vectors, the designer usually has little up front knowledge of the functionality exercised by the error vectors generated as counter-examples by the formal verification tool. Because of this, there is a need for new techniques for error diagnosis in combinational verification.

In combinational verification, the equivalence between the Boolean expressions for the implementation and specification is checked. The use of Binary Decision Diagrams (BDDs) for combinational verification is common. (See, R. Bryant, "Graph based algorithms for Boolean function manipulation" IEEE Transactions on Computers, C-35(8):677–691, August 1986.) PODEM-based or Boolean satisfiability (SAT) based ATPG-like techniques can also be effective in many cases where BDDs cannot be used. (See, D. Brand, "Verification of large synthesized circuits", Proceedings of ICCAD, pp. 534–537, 1993; S. Reddy, W. Kunz and D. Pradhan, "Novel verification framework combining structural and OBDD methods in a synthesis environment", Proceedings of DAC, pp. 414–419, 1995; and J. Silva and K. Sakallah, "Grasp-A new search algorithm for satisfiability", Proceedings of ICCAD, pp. 220–227, 1996). The use of combinations of BDDs and ATPG-like techniques has also been proposed. (See, J. Burch and V. Singhal, "Tight integration of combinational verification methods", Proceedings of ICCAD, pp. 570–576, 1998; A. Gupta and P. Ashar, "Integrating a Boolean satisfiability checker and BDDs for combinational verification", Proceedings of VLSI Design 98, pp. 222–225, 1998; J. Jain, R. Mukherjee and M. Fujita, "Advanced verification techniques based on learning", Proceedings of DAC, June 1995; and S. Reddy, W. Kunz and D. Pradhan, IBID).

All these techniques basically try to prove that the XOR of the corresponding outputs in the two representations (the output of the "miter circuit") is tautologically zero. The BDD-based method does so by building the BDD for the output of the XOR gate (the "error BDD"). SAT based methods typically represent the functionality of the miter circuit in Conjunctive Normal Form (CNF) and apply a branch-and-bound algorithm to exhaustively check if the output of the miter circuit can be set to '1' (true) for any input combination.

If an error is found in the implementation, all the verification techniques are equipped to determine the vectors exercising the error (the "error vectors"). In the case of the BDD-based method, all the error vectors are encapsulated in the error BDD. In the SAT method, they are produced in the form of cubes. Diagnosis information can be derived by a detailed analysis of the internal behavior of the implementation circuit for these error vectors. Various techniques have been proposed to perform this task. Several of these techniques are discussed below.

Complementation Method

The complementation method uses the following technique: Given an error vector, it is simulated once on the implementation circuit and the value produced at each wire in the circuit is recorded. In the next step, for each wire in the circuit, the value on the wire is complemented and the effect of the complementation is propagated by simulation to the primary outputs. If the value on some erroneous output gets corrected by the complementation and the values on all the correct outputs remain unchanged, the wire that was complemented is considered a potential error site. Its count is correspondingly incremented by 1. After a large number of error vectors has been simulated in this manner, the wires with the largest counts are considered the most likely to be error sites. A heuristic could be to pick the 10% of the wires with the highest counts. In the case of a single error in the circuit, the actual error site is guaranteed to be one of the sites with the highest count. In the presence of multiple errors affecting the same primary output, the actual error sites are likely to have high counts, but are not guaranteed to have the largest count. (See, S. Huang, K-C Chen, and K-T Cheng, "Error Correction Based on Verification Techniques", Proceedings of DAC, pp. 258–261, 1996).

The complementation method is simulation intensive. In general, each node in the transitive fanin cone of the erroneous output is a potential error site. Each error vector is simulated once for the entire circuit and then repeatedly for the fanout cone of each site being evaluated. Given a fixed amount of time, the quality of this method (and of the other methods described in this section) depends on the number of error vectors simulated. While it leads to the desired pruning out of non-error sites, its quality will suffer rapidly in a naive application as the size of the circuit, and thereby the number of potential error sites increases. To speed up this method, one needs to make the core simulation routines very fast and prune the number of candidate error sites before applying the method.

An example specification and its incorrect implementation are shown in FIGS. 1 and 2. FIG. 3 shows net h being complemented, and its fanout being simulated again for the error vector 001. It can be seen that the erroneous output z gets corrected as a result, while the correct output y remains unchanged.

Path Backtrace Based Method

Another method that is used tries to identify error sites by tracing sensitized paths back from erroneous outputs for each error vector. (See, A. Kuehlman, D. Cheng, A. Srinivasan and D. LaPotin, "Error diagnosis for transistor-level verification", Proceedings of DAC, pp. 218–223, 1994). As in the simulation-based method, a count is maintained for the number of error vectors for which a site is on such a sensitized path. Sites with the largest counts are considered the most likely to be the actual error sites. As in the simulation-based method, the error vector must be simulated once and the values noted for each wire. The difference is that instead of simulating repeatedly after complementation of each site, sites on sensitized paths to the erroneous output are identified in a single pass through the implementation circuit. On the other hand, this backtrace method is also likely to tag many more sites as potential error sites than the complementation method. As a result, it is faster, but results in less localization.

FIG. 4 shows the sensitized paths to the erroneous output being traced backward by Kuehlmann's method. The wires shown in gray have their counts incremented for the error vector 001. Note that in this case, all the wires would also have been tagged by the complementation method, except that the backtrace method does it in a single pass through the circuit.

X-Analysis Method

Unlike the backtrace method, the X-analysis method analyzes the circuit from the input for each error vector using a technique which is somewhat like what designers use when diagnosing errors manually. (See, M. Tomita, H. Jiang, T. Yamamoto and Y. Hayashi, "An algorithm for locating logic design errors", Proceedings of ICCAD, pp. 468–471, November 1990). Given an error vector V, this method first tries to find a second vector V' which is not an error vector and which differs from V in a single input bit. Also, V and V' should produce the same value on the erroneous output in the implementation circuit and produce different values on that output in the specification. If such a vector pair is found, it is then simulated with an X on the input bit in which V and V' differ. Since the output values differ in the specification, the specification output will produce an X. Since the implementation produces the same value at the erroneous output for V and V', it will not have an X at that output. The gates at which an X value gets blocked and the gates in its transitive fanin are considered potential error sites by this method. As before, a count is maintained. A more detailed analysis of the paths leading to the blocked gates using the path-based backtrace method can lead to further pruning. Sites with the largest counts are the most likely to be the actual error sites. The goal is to analyze the implementation for as many vector pairs as possible.

FIG. 5 and 6 show the simulation of the input vector X01 on the specification and implementation circuits. 001 is an error vector, while 101 is not. It can be seen that an X is produced at output y in the specification while a 0 is produced at y in the implementation. Since X propagation is blocked at nets o and p in the implementation, all gates in the transitive fanin of o and p will have their counts incremented by this vector pair.

The X-analysis method complements the backtrace method since it performs the analysis from input to output while the backtrace method performs the analysis from output to input. As in the backtrace method, the X-based method also identifies many more false error sites than the simulation method. A drawback of Tomita's method is that computing the vector pair from the error vector is a time consuming task—making it much slower than the backtrace method.

Vector Pair Computation Methods

The vector pair computation can be done in the following ways:

Simulation-based method: For each error vector, go through each input bit. Complement it and check if the specification output changes while the implementation output remains the same. If it does, this is a useful vector pair. This requires one simulation each of the specification and implementation circuits for each error vector, and one more simulation each of the two circuits per candidate input. The requirement of multiple simulations make this much slower than the backtrace method.

BDD-based method: Another approach for computing the vector pairs is to use BDD operations. If E is the error BDD encapsulating all the error vectors, S is the BDD for the specification output, and x is the candidate input, the set of all useful vector pairs for that input (in terms of the values on rest of the inputs) is given by the expression $(S_x$ XOR $S_{x'})\cdot (E_x$ XOR $E_{x'})$. Naturally, this approach can only be used if the required BDDs are available.

SAT-based method: A third approach is to set up a Boolean formula based on the same equations as used in the BDD-based method. Solutions to the formula yield the desired vector pairs. The formula can be solved using a Boolean Satisfiability (SAT) solver like GRASP. (See, J. Silva and K. Sakallah, "Grasp-A new search algorithm for satisfiability", Proceedings of ICCAD, pp. 220–227, 1996 for a discussion of GRASP).

Missing-Line Errors in X-Analysis Method

The X-analysis method has the drawback of not being able to handle missing-line errors effectively since it relies on propagation of X in the erroneous implementation. Consider the circuit fragment in FIG. 7. The dotted wire on Gate 1 indicates the missing connection. It is clear that for the vector shown, the X is blocked at a gate not in the fanout of Gate 1. As a result, Gate 1 is not flagged as a potential error site.

Other Methods

A number of other methods have been proposed in the past for error diagnosis in combinational verification. See, as examples: M. Abadir, J. Ferguson and T. Kirkland, "Logic design verification via test generation", IEEE Transactions on CAD, vol. 7, no. 1, pp. 138–148, 1988; Y. Kukimoto and M. Fujita, "Rectfication method for lookup-table type FPGAs", Proceedings of ICCAD, pp. 54–61, 1992; J. Madre, O. Coudert and P. Billon, "Automating the diagnosis and rectification of design errors with PRIAM", Proceedings of ICCAD, pp. 30–33, 1989; K. Tamura, "Locating functional errors in logic circuits", Proceedings of DAC, pp. 185–191, 1989; and Y. Watanabe and R. Brayton, "Incremental synthesis for engineering change", Proceedings of ICCD, pp. 40–43, 1991. The above methods do not approach the effectiveness and general applicability of the three methods described above.

SUMMARY OF THE INVENTION

One object of the present invention is to perform a diagnosis technique which maximizes the error site localization, ensures that the actual error sites are included in the sites identified, and takes a reasonable amount of time to do it.

According to the first aspect of this invention, a method of diagnosing an error in combinational verification of a Boolean expression of a circuit and a specification of said circuit is disclosed. The process step include: generating a first set of potential error sites causing a nonequivalence of the Boolean expression and the specification using a first technique that operates quickly; generating a second set of potential error sites, smaller in number than the first set of potential error sites, using a second technique that operates on the first set of potential error sites, where the second technique is slower than the first technique but more accurate; and finally, proving that a specific potential error site, contained in the second set of potential error sites, is an actual error site.

In another embodiment, the first technique is a X-Based method. In another embodiment the first technique is a backtrace method. Alternatively, the first technique is a combination of a backtrace method and a X-based method. Additionally, the second technique may be a complementation method.

In another embodiment, a method of proving that a potential error site is an actual error site causing a non-equivalence of an implementation circuit and a specification circuit is provided. The process steps include: inputting outputs of the specification circuit and the implementation circuit into a first miter circuit, that outputs a zero value if the outputs of the specification and implementation circuits are the same; forming a modified implementation circuit used to test the potential error site by replacing the potential error site with a multiplexor with data inputs being an original input to the potential error site and its complement, where the control of the multiplexor is the output of the first miter circuit; inputting outputs of the specification circuit and the modified implementation circuit into a second miter circuit, that outputs a zero value if the outputs of the specification and modified implementation circuits are the same; checking if the output of the second miter is always zero (for all possible input vectors), and determining that the potential error site is an actual error site when the output of the second miter is always zero. In another embodiment, an improved backtrace method of diagnosing an error in combinational verification of a circuit having sites containing logical gates is claimed. The steps of the method include: generating and simulating a 32-bit vector; reading the inputs and output for a particular gate of the logical gates, for each input determining bits of the vector for which the input and the output of the particular gate are the same; tagging the bits of the vector for that input path; and performing a bit-wise OR of said tagged bits from fanouts at each site to determine the contribution of each path connecting said logical gates.

Another embodiment is directed to an improved X-based analysis method of diagnosing an error in combinational verification of a circuit having sites containing logical gates. The steps comprise: dividing 32-bit words, serving as input vectors, into upper halves and lower halves; storing a vector pair in identical bit positions within the upper and lower halves of a particular word as complements for a given input of the inputs, and setting the upper and lower halves of the word to be identical for other inputs of the inputs; inputting the input vectors into the gate inputs; monitoring the gate output for each gate going backward from the output of the circuit through to the inputs of the circuit, determining if the gate outputs are the same bit-wise as the gate inputs; and incrementing a count value for each gate according to the number of said bits that are different.

BRIEF DESCRIPTION OF THE DRAWINGS

FIG. 1 illustrates a correct specification of a circuit with a distinguishing vector.

FIG. 2 illustrates an incorrect specification of a circuit with a distinguishing vector.

FIG. 3 illustrates correcting of circuit of FIG. 2 to obtain the correct output.

FIG. 4 illustrates the Backtrace method applied to an incorrect circuit.

FIG. 5 illustrates a correct circuit with a vector pair.

FIG. 6 illustrates an incorrect circuit with a vector pair.

FIG. 7 illustrates the X-Analysis method applied to a circuit.

FIG. 8 illustrates a circuit for performing a proof for the final error site check.

DETAILED DESCRIPTION OF THE PREFERRED EMBODIMENTS

The present invention performs an error diagnosis by a method that gradually increases the level of detail in the analysis, in which fast-but-relatively-inaccurate methods are used initially, followed by accurate-but-slow methods. A final proof check is performed at the end.

Based on experience with the complementation, backtrace, and X-based methods, it is clear that the complementation method provides the maximum amount of localization but is the slowest. The backtrace and X-based methods are faster but result in less localization. The present invention uses the backtrace and X-based methods initially to reduce the number of potential error sites to a fraction of the total number of wires in the circuit.

These sites are then provided as candidates to the complementation method. As a result, the system or process has to evaluate and update the counts of a much smaller number of sites. As opposed to the prior art processes which operate independently, the present invention does not have to consider all nodes in the transitive fanin cone of the erroneous output as potential error sites.

Figure 9:
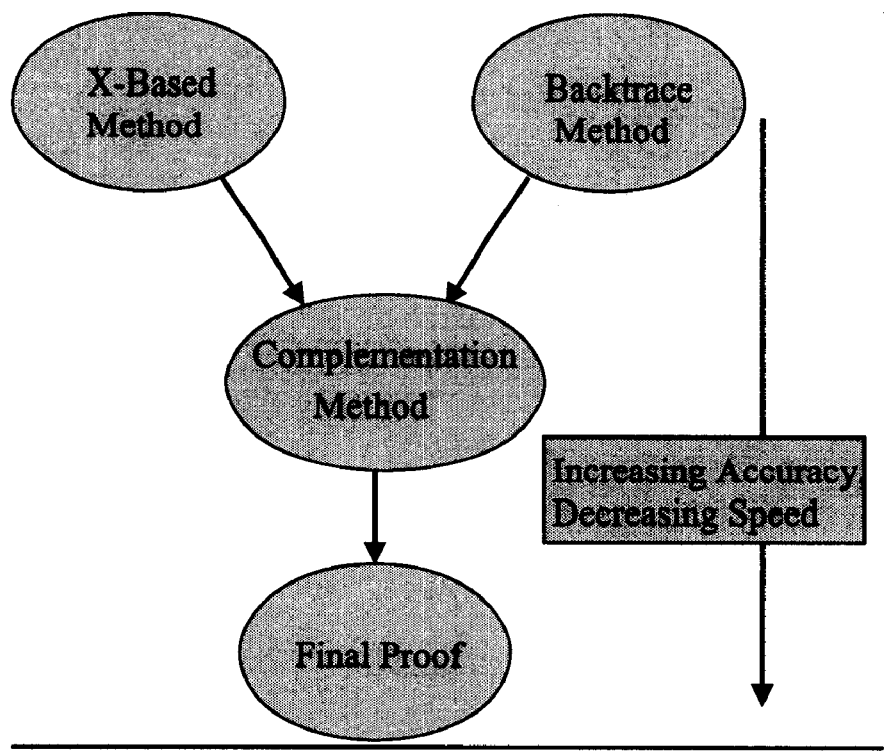
FIG. 9 depicts schematically the overall flow of the process of the present invention.

If the "single-error" model is being followed, a final comprehensive but expensive proof check can be used after the complementation method. The complete flow of the present invention is shown in FIG. 9.

The final test tries to formally prove that a given site is indeed an error site. Since it is expensive, it cannot be used very often. FIG. 8 shows the test in circuit form, where S is the specification circuit, I is the implementation circuit, I' is a version of the implementation circuit modified to test a particular error site. "MITER" corresponds to a disjunction of the XORs of the corresponding outputs from S and I (or S and I'). The modification in I' is to replace the given site with a multiplexor whose two data inputs are the net from the original site and its complement. The control input to the multiplexor is the output of the MITER of S and I. Basically, the circuit sets up a Boolean formula which checks that for each error vector (when MITER of S and I outputs 1), complementing the value at the given site results in correct output values (MITER of S and I' outputs 0). If it doesn't, then the given site is not a true error site. Note that the idea is very similar to the complementation method. However, rather than relying on simulation of a finite number of error vectors, this test performs the proof implicitly for all error vectors. The formula itself can be checked by using a SAT solver like GRASP or using Binary Decision Diagrams. [See, S. Reddy, W. Kunz and D. Pradhan, IBID]. Note that in addition to the clauses for the gates of S and I, the formula contains additional clauses only for the fanout cone of the error site, for the two miters and for the multiplexor.

When multiple errors are present in the implementation circuit, even the final proof check is only a heuristic, since it is possible that multiple sites need to be fixed simultaneously in order to correct the erroneous outputs for any error vector.

In order to maximize the number of vectors analyzed in the backtrace method, a novel 32-way backtrace technique for sensitized-path analysis is used. The technique uses the observation that for both an AND and an OR gate, an input value contributes to the output value only if they are the same. Therefore, given an AND/OR gate and 32-bit vectors of values on its input and output lines, a bit-wise XNOR is taken of those vectors to tag the inputs. Each bit set in the tag denotes the vector for which the input contributes to determining the output value. Furthermore, in the present invention, reconvergence at a node can be handled simply by performing a bit-wise OR of such tags for accumulating the contribution of each path. The use of such a parallel technique enabling the backtrace for 32 vectors in a single pass through the circuit has not been proposed before in the prior art.

The 32-bit vector of values at the output of each gate is determined by means of a 32-bit error vector simulation. The backtrace then proceeds through all the gates ordered from output to input, taking an XNOR of each gate input-output pair. For a complex gate, the internal representation is assumed to be in sum-of-products form. The value vectors at the outputs of the internal AND gates must be recomputed in this case. The repeated XNOR-based procedure is then carried out for the sum-of-products as above.

Sample code for a simple and fast backtrace loop for a complex gate is shown below. (The loop for an AND gate would be much simpler.) The outer loop goes through each cube of the sum-of-products form. The first inner loop recomputes the output of this cube. If the value computed is the same as the output of the complex gate, the second inner loop backtraces to the inputs of this cube. The macro GETINPUT(cube, j) determines the phase of the jth input of the cube.

```
for (i = num_cubes; i--; ) {
/* recompute the intermediate AND results */
    and_result = ALL_ONE_MASK;
    cube = GETSET(F, i);
    for (j=nin; j--; ) {
        and_result &= (GET_SIM_VALUE(fanin[j]))
            [GETINPUT(cube, j)];
    }
    mask = ~(and_result ^ opval);
    if (mask) {
        /* intermediate AND value affects output */
        /* therefore propagate it backwards */
        for (j=nin; j--; ) {
            phase = GETINPUT(cube, j);
            if (phase != DONTCARE) {
                DIAG(fanin[j])->visited |=
                (visited & mask &
                ~(GET_SIM_VALUE(fanin[j])[phase] ^
                opval));
            }
        }
    }
}
```

In order to maximize the number of vectors analyzed in the X-based analysis method, a novel approach for analyzing 16 vector pairs in parallel is used. The main idea is to use 32-way 0/1 simulation to capture the effect of 16-way 0/1/X simulation using vector pairs, where X is naturally represented as (0,1) or (1,0) in the vector pair. For each net, one vector pair is stored in identical bit positions within the upper and lower halves of a 32-bit word. Recall that the X-based method uses vector pairs which differ in the value of only one primary input. Therefore, once 16 such vector pairs for a given input are known, they are stored such that the upper and lower halves of the given input are complements (to denote the X), while the upper and lower halves of all other inputs are identical (property of vector pairs used in the X-based method). In the first pass through the circuit, these inputs words are simulated on the implementation circuit, effectively simulating 16 vector pairs simultaneously.

In the second pass through the circuit, the procedure visits each gate from output to inputs, computing a value denoting its candidacy for each of the 16 vector pairs. First, it is checked if any of its input is an X while the output is not. To determine if an internal signal in the circuit has an X, its upper and lower halves are XOR'ed with each other to tag the positions with an X. Therefore, for each gate, the computed value is simply a bit-wise AND of the input tag and complement of the output tag, while performing a bit-wise OR over all its inputs. Next, the computed value is modified to account for contributions from any X-blocked gate in its transitive fanout cone. Finally, the count of each gate is incremented by the number of bit positions which are set in the computed value. Clearly, this method is fast because it computes the counts for 16 vectors pairs in only two passes through the implementation circuit.

The pseudo code for the 16-way X-analysis procedure is shown below. DIAG(node) is a macro which fetches the pointer to the data structure for diagnosis for each internal node in the circuit. Diag_node_is_x_32( ) determines the tag denoting bit positions that are X's. The value visited is computed as the bit-wise AND of inval and outval. The loop after that collects the visited fields from all the fanouts of node. diag_count_ones32( ) counts the number of 1's in the visited field.

```
foreach_node(implementation, node) {
    visited = 0;
    foreach_fanin(node, j, fanin) {
        inval = diag_node_isx_32(fanin);
        opval = ~(diag_node_isx_32(node)) &
            L_HALF_MASK;
        visited |= inval & opval;
        funout = DIAG(node)->fanout;
        for (j=DIAG(node)->nout; j--; ) {
            fout = (node_t *) fanout[j];
            visited |= DIAG(fout)->visited;
        }
        count = diag_count_ones_32(visited);
        if (count)
            diag_add_n_update_errsrcs(node,
                visited, count, info, options);
    }
}
```

Since all methods rely upon simulation of error vectors, use of a core simple and fast 32-way simulation procedure allows for increased speed. The simulation is as fast as is possible without actually resorting to compiled code simulation. The gates to be evaluated are scheduled statically. For each two-input Boolean operation, the procedure determines the 32-bit input vectors in the correct phase and computes the output by means of a simple bit-wise Boolean operation. The operation type is known beforehand by virtue of the way in which gates are represented internally. The pseudo code for the simulation procedure for each gate is shown below.

```
for (n = F->count; i--; ) {
    and_result = 0xffffffff;
    cube = GETSET(F, i);
    for (j = nin; j--; ) {
        and_result &=
            (GET_SIM_VALUE(fanin[j]))
                [GETINPUT(cube, j)];
    }
    result |= and_result;
}
value = GET_SIM_VALUE(node);
value[ONE] = result;
value[ZERO] = result;
value[TWO] = 0xffffffff;
```

F is the representation for the sum-of-products form. GETSET(F, i) fetches the ith cube from F. The values of the fanins to F are precomputed for each phase and stored in the array value[ ] for each gate. The array and the correct value are fetched in the statement (GET_SIM_VALUE(fanin[j])) [GETINPUT(cube,j).

The three basic methods, complementation, backtrace, and X-based analysis, were implemented within a prototype based on SIS. (See, E. Sentovich et al, "Sequential circuit design using synthesis and optimization", Proceedings of ICCD, 1992). The implementation of the present invention includes the parallel enhancements described above. In comparison to the earlier proposals for these methods, [See, A. Kuehlman, D. Cheng, A. Srinivasan and D. LaPotin, "Error diagnosis for transistor-level verification", Proceedings of DAC, pp. 218–223, 1994; M. Tomita, H. Jiang, T. Yamamoto and Y. Hayashi, "An algorithm for locating logic design errors", Proceedings of ICCAD, pp. 468–471, November 1990; and S. Huang, K-C Chen, and K-T Cheng, "Error Correction Based on Verification Techniques", Proceedings of DAC, pp. 258–261, 1996 ], the parallel versions resulted in a factor of 8–150 increase in the number of vectors simulated per unit time.

In addition to using the individual methods, the present invention also allows for using any combination of the above methods, where the candidate set of potential error sites can be accumulated as union/intersection of sites found by individual methods. As discussed above, the main approach is to use the X-based method and backtrace method independently, and then pass the union/intersection of their potential sites as the candidate set for the complementation method.

Figure 10:
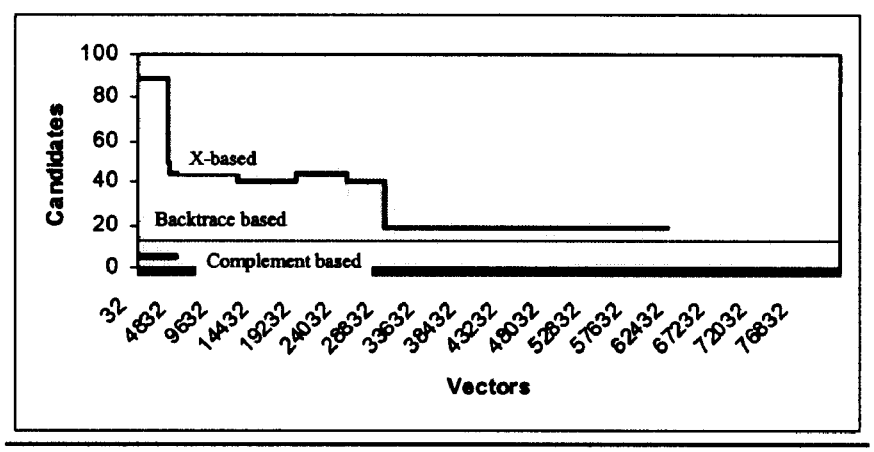
FIG. 10 graphically represents the behavior of the three methods discussed.

FIG. 10 shows a typical graph which plots the number of error sites reported by the program against the number of error vectors simulated, for each of the three individual methods for a given amount of time.

The number of vectors simulated by the complementation method is orders of magnitude smaller than those simulated by the other two methods. On the other hand, it reports the smallest number of potential error sites. This graph, in some sense, represents the justification for the approach of using the other two methods as fast filters for the complementation method.

Two main sets of experiments were conducted for evaluation of various combinations—one set of examples with single errors, and another set with multiple errors. Circuits from the ISCAS benchmark suite were used as specification circuits. For each specification, gates were randomly chosen in the circuit and various kinds of errors were introduced to generate the erroneous implementation circuits. Many classes of errors were considered, including missing inverter/line/minterms and additional inverter/line/minterms.

As a first cut, two-method combinations were used consisting of: backtrace followed by complementation, and X-analysis followed by complementation. Although both of these combinations improved the number of vectors simulated, they were not fully effective, in that they missed some real error sites, and/or reported too many error sites.

The next attempt was to combine all three methods as outlined earlier. In order to assess the benefit of such combination, the combination was compared for its performance against running the complementation method alone for the same amount of time as all three methods combined. In the tables that follow, the CPU time does not include the time taken for generation of error vectors (same for all methods), but it does include the time taken for generating the special vector pairs for X-analysis method. In the experiments, BDD-based techniques were used for generating both.

TABLE 1

Results for Single Error Implementations (with Intersection)

| | | Complementation Method Alone | | | | | Complementation Method in Combination | | | | |
|---|---|---|---|---|---|---|---|---|---|---|---|
| Name | Out# | Time(s) | #Match | #Err | #Cand | #Vec(K) | Time(s) | #Match | #Err | #Cand | #Vec(K) |
| c1355 | 18 | 202 | 1 | 18 | 790 | 3 | 120 | 1 | 46 | 46 | 30 |
| c1355 | 19 | 202 | 1 | 29 | 790 | 3 | 120 | 1 | 49 | 70 | 20 |
| c1355 | 22 | 202 | 1 | 18 | 790 | 3 | 120 | 1 | 46 | 46 | 30 |
| c1355 | 23 | 202 | 1 | 19 | 790 | 3 | 120 | 1 | 49 | 71 | 19 |
| c1355 | 26 | 202 | 1 | 18 | 790 | 3 | 120 | 1 | 46 | 46 | 30 |
| c1355 | 27 | 202 | 1 | 27 | 790 | 3 | 120 | 1 | 49 | 71 | 20 |
| c1355 | 30 | 202 | 1 | 18 | 790 | 3 | 120 | 1 | 46 | 46 | 35 |
| c1355 | 31 | 202 | 1 | 19 | 790 | 3 | 120 | 1 | 49 | 70 | 20 |
| c2670 | 129 | 300 | 1 | 32 | 561 | 13 | 180 | 1 | 13 | 32 | 95 |
| c2670 | 130 | 300 | 1 | 31 | 562 | 13 | 180 | I | 13 | 32 | 95 |
| c2670 | 132 | 300 | 1 | 23 | 261 | 24 | 180 | 1 | 1 | 2 | 374 |
| c2670 | 136 | 301 | 1 | 6 | 594 | 12 | 180 | 1 | 5 | 47 | 31 |
| c2670 [001b] | 138 | 301 | 1 | 28 | 1395 | 7 | 180 | 1 | 4 | 55 | 34 |
| c2670 | 139 | 301 | 1 | 29 | 1396 | 7 | 180 | 1 | 4 | 611 | 31 |
| c5315 | 56 | 500 | 1 | 7 | 72 | 97 | 300 | 1 | 4 | 4 | 375 |
| c5315 | 77 | 500 | 1 | 12 | 171 | 48 | 300 | 1 | 4 | 4 | 352 |
| c5315 | 81 | 500 | 1 | 12 | 171 | 48 | 300 | 1 | 4 | 4 | 351 |

TABLE 1-continued

Results for Single Error Implementations (with Intersection)

| | | Complementation Method Alone | | | | | Complementation Method in Combination | | | | |
|---|---|---|---|---|---|---|---|---|---|---|---|
| Name | Out# | Time(s) | #Match | #Err | #Cand | #Vec(K) | Time(s) | #Match | #Err | #Cand | #Vec(K) |
| c5315 | 83 | 500 | 1 | 14 | 173 | 47 | 300 | 1 | 4 | 4 | 352 |
| c5315 | 87 | 500 | 1 | 14 | 173 | 47 | 300 | 1 | 4 | 4 | 337 |
| c880 | 18 | 200 | 1 | 22 | 187 | 75 | 120 | 1 | 5 | 20 | 174 |
| c880 | 19 | 200 | 1 | 14 | 165 | 82 | 120 | 1 | 5 | 20 | 176 |
| c880 | 21 | 200 | 1 | 24 | 222 | 66 | 120 | 1 | 5 | 20 | 173 |
| c880 | 22 | 200 | 1 | 36 | 304 | 58 | 120 | 1 | 5 | 20 | 166 |
| c880 | 23 | 200 | 1 | 32 | 275 | 61 | 120 | 1 | 5 | 20 | 169 |
| c880 | 24 | 200 | 1 | 33 | 262 | 61 | 120 | 1 | 5 | 20 | 174 |
| s39417 | 571 | 600 | 1 | 6 | 36 | 84 | 360 | 1 | 2 | 3. | 137 |
| s39417 | 572 | 600 | 1 | 8 | 39 | 80 | 360 | 1 | 2 | 3 | 136 |
| s39417 | 573 | 600 | 1 | 10 | 42 | 76 | 360 | 1 | 2 | 3 | 136 |
| s39417 | 574 | 600 | 1 | 13 | 45 | 72 | 360 | 1 | 2 | 3 | 136 |

Table 1 shows the results for experiments with single error implementations. For these experiments, the intersection of the sets of top 10% sites identified individually by the backtrace and X-analysis methods were used as the filtered set of candidates to pass to the complementation method. In the single error model, intersection of those sets allows for effective pruning. In the table, Columns 1 and 2 indicate the circuit name and the index of the erroneous output, respectively. Columns 3–7 denote data for the complementation method when working independently, and Columns 8–12 denote data for the complementation method when working in combination with the other two methods. Columns 3 and 8 denote the CPU time (in 15 seconds). Columns 4 and 9 denote whether or not the reported error sites contained the true error site. Columns 5 and 10 denote the number of reported error sites. Columns 6 and 11 denote the number of candidate sites which the method evaluated. Columns 7 and 12 denote the number of vectors simulated.

As can be seen clearly from Column 4, the complementation method is very accurate in that it does not miss any true error site. The benefit of the combination approach can be seen in the observation that in most examples, the number of reported error sites decreases considerably (Column 5 vs. Column 10), while making sure that the accuracy is not lost. For example, for the circuit C2670, the number of error sites is reduced from 28 to 4 for output #138. This is possible because the number of candidates to be evaluated decreased from 1395 to 55, resulting in an increase in the number of simulated vectors from 7K to 34K. This provides evidence of the efficacy of the combination approach for decreasing the number of candidates for the complementation method (Column 6 vs. Column 11), thereby allowing simulation of an increased number of vectors (Column 7 vs. Column 12).

TABLE 2

Results for Multiple Error Implementation (with Union)

| | | Complementation Method Alone | | | | | Complementation Method in Combination | | | | |
|---|---|---|---|---|---|---|---|---|---|---|---|
| Name | Out# | Time(s) | #Match | #Err | #Cand | #Vec(K) | Time(s) | #Match | #Err | #Cand | #Vec(K) |
| c1908p10 | 15 | 201 | 0 | 1 | 496 | 5 | 120 | 0 | 1 | 493 | 3 |
| c1908p25 | 15 | 201 | 1 | 2 | 496 | 5 | 120 | 0 | 1 | 493 | 3 |
| c1908p50 | 15 | 201 | 1 | 6 | 496 | 5 | 121 | 1 | 2 | 493 | 3 |
| c3540p10 | 10 | 401 | 1 | 3 | 799 | 5 | 240 | 1 | 3 | 799 | 3 |
| c3540p10 | 18 | 404 | 1 | 7 | 2390 | 3 | 242 | 1 | 7 | 2256 | 2 |
| c3540p10 | 19 | 400 | 1 | 9 | 2401 | 3 | 241 | 1 | 9 | 1278 | 2 |
| c3540p25 | 10 | 400 | 1 | 3 | 799 | 5 | 241 | 1 | 3 | 799 | 3 |
| c3540p25 | 18 | 401 | 1 | 48 | 2390 | 3 | 240 | 1 | 48 | 2203 | 2 |
| c3540p25 | 19 | 401 | 1 | 63 | 2401 | 3 | 240 | 1 | 63 | 1373 | 2 |
| c3540p50 | 10 | 400 | 1 | 4 | 799 | 5 | 241 | 1 | 4 | 799 | 3 |
| c3540p50 | 18 | 401 | 1 | 48 | 2390 | 3 | 242 | 1 | 48 | 2083 | 2 |
| c3540p50 | 19 | 402 | 1 | 63 | 2401 | 3 | 240 | 1 | 63 | 1614 | |
| c7552p10 | 81 | 400 | 0 | 1 | 100 | 57 | 240 | 0 | 1 | 20 | 72 |
| c7552p25 | 81 | 400 | 1 | 2 | 100 | 57 | 240 | 1 | 2 | 48 | 44 |
| c7552p50 | 81 | 400 | 1 | 4 | 100 | 58 | 240 | 1 | 3 | 92 | 35 |
| s15850p10 | 141 | 304 | 2 | 11 | 1692 | 1 | 186 | 2 | 11 | 1691 | 1 |
| s15850p10 | 142 | 304 | 1 | 14 | 1696 | 1 | 186 | 1 | 14 | 1696 | 1 |
| s15850p10 | 162 | 300 | 1 | 9 | 9 | 216 | 180 | 1 | 9 | 9 | 130 |
| s15850p25 | 141 | 303 | 2 | 11 | 1692 | 1 | 186 | 2 | 11 | 1691 | 1 |
| s15850p25 | 142 | 304 | 1 | 14 | 1696 | 1 | 186 | 1 | 14 | 1696 | 1 |
| s15850p25 | 162 | 300 | 1 | 9 | 9 | 216 | 180 | 1 | 9 | 9 | 130 |

TABLE 2-continued

Results for Multiple Error Implementation (with Union)

| | | Complementation Method Alone | | | | Complementation Method in Combination | | | | |
|---|---|---|---|---|---|---|---|---|---|---|
| Name | Out# | Time(s) | #Match | #Err | #Cand | #Vec(K) | Time(s) | #Match | #Err | #Cand | #Vec(K) |
| s15850p50 | 141 | 303 | 2 | 18 | 1692 | 1 | 187 | 2 | 18 | 1691 | 1 |
| 15850p50 | 142 | 304 | 1 | 14 | 1696 | 1 | 1871 | 11 | 14 | 1696 | 1 |
| s15850p50 | 162 | 00 | 1 | 9 | 9 | 216 | 180 | 1 | 9 | 9 | 130 |
| s38584p10 | 438 | 600 | 1 | 9 | 73 | 34 | 360 | 1 | 9 | 26 | 41 |
| s38584p10 | 933 | 600 | 1 | 9 | 80 | 26 | 360 | 1 | 9 | 26 | 41 |
| s38584p10 | 934 | 601 | 1 | 11 | 85 | 25 | 360 | 1 | 11 | 29 | 39 |
| s38584p10 | 982 | 600 | 0 | 5 | 215 | 14 | 361 | 0 | 5 | 210 | 8 |
| s38584p10 | 985 | 600 | 1 | 9 | 249 | 12 | 360 | 0 | 4 | 57 | 24 |
| s38584p10 | 986 | 600 | 0 | 6 | 68 | 36 | 160 | 0 | 6 | 27 | 40 |
| s38584p10 | 988 | 600 | 0 | 6 | 59 | 39 | 360 | 0 | 6 | 27 | 40 |
| s38584p10 | 989 | 600 | −0 | 6 | 68 | 36 | 360 | 0 | 6 | 27 | 40 |
| s38584p10 | 990 | 600 | 0 | 6 | 59 | 39 | 360 | 0 | 6 | 27 | 41 |
| s38584p25 | 438 | 600 | 1 | 9 | 73 | 34 | 360 | 1 | 9 | 26 | 41 |
| s38584p25 | 933 | 600 | 1 | 9 | 80 | 26 | 360 | 1 | 9 | 26 | 41 |
| s38584p25 | 933 | 600 | 1 | 9 | 80 | 26 | 360 | 1 | 9 | 26 | 41 |
| s38584p25 | 934 | 600 | 1 | 11 | 85 | 25 | 360 | 1 | 11 | 45 | 25 |
| s38584p25 | 982 | 601 | 1 | 9 | 215 | 14 | 360 | 1 | 9 | 210 | 8 |
| s38584p25 | 985 | 601 | 1 | 12 | 249 | 12 | 360 | 1 | 12 | 89 | 17 |
| s38584p25 | 986 | 600 | 1 | 10 | 68 | 36 | 360 | 1 | 10 | 28 | 40 |
| s38584p25 | 988 | 600 | 1 | 10 | 59 | 40 | 360 | 1 | 10 | 28 | 40 |
| s38584p25 | 989 | 600 | 1 | 10 | 68 | 36 | 360 | 1 | 10 | 28 | 40 |
| s38584p25 | 990 | 600 | 1 | 10 | 59 | 40 | 360 | 1 | 10 | 28 | 40 |
| s38584p50 | 438 | 600 | 1 | 17 | 73 | 34 | 360 | 1 | 15 | 68 | 22 |
| s38584p50 | 933 | 600 | 1 | 18 | 80 | 26 | 360 | 1 | 16 | 70 | 17 |
| s38584p50 | 934 | 600 | 1 | 20 | 85 | 25 | 360 | 1 | 20 | 81 | 16 |
| s38584p50 | 982 | 600 | 1 | 16 | 215 | 14 | 361 | 1 | 14 | 210 | 8 |
| s38584p50 | 985 | 600 | 1 | 23 | 249 | 12 | 361 | 1 | 23 | 210 | 8 |
| s38584p50 | 986 | 600 | 1 | 19 | 68 | 36 | 360 | 1 | 16 | 52 | 26 |
| s38584p50 | 988 | 600 | 1 | 19 | 59 | 39 | 360 | 1 | 16 | 52 | 26 |
| s38584p50 | 989 | 600 | 1 | 19 | 68 | 36 | 360 | 1 | 16 | 52 | 26 |
| s38584p50 | 990 | 600 | 1 | 19 | 59 | 39 | 360 | 1 | 18 | 56 | 24 |
| s9234p10 | 103 | 200 | 1 | 2 | 38 | 122 | 120 | 1 | 2 | 38 | 73 |
| s9234p10 | 144 | 200 | 1 | 6 | 56 | 99 | 120 | 1 | 6 | 46 | 65 |
| s9234p10 | 145 | 200 | 1 | 6 | 56 | 100 | 120 | 1 | 6 | 46 | 65 |
| s9234p10 | 146 | 200 | 1 | 6 | 56 | 100 | 120 | 1 | 6 | 46 | 63 |
| s9234p10 | 147 | 200 | 1 | 6 | 58 | 97 | 120 | 1 | 6 | 46 | 64 |
| s9234p10 | 148 | 200 | 1 | 6 | 58 | 98 | 120 | 1 | 6 | 46 | 65 |
| s9234p25 | 103 | 200 | 1 | 2 | 38 | 121 | 120 | 1 | 2 | 38 | 73 |
| s9234p25 | 144 | 200 | 1 | 6 | 56 | 99 | 120 | 1 | 6 | 46 | 65 |
| s9234p25 | 145 | 200 | 1 | 6 | 56 | 99 | 120 | 1 | 6 | 46 | 65 |
| s9234p25 | 146 | 200 | 1 | 6 | 56 | 99 | 120 | 1 | 6 | 46 | 65 |
| s9234p25 | 147 | 200 | 1 | 6 | 58 | 97 | 120 | 1 | 6 | 46 | 65 |
| s9234p25 | 148 | 200 | 1 | 6 | 58 | 97 | 120 | 1 | 6 | 46 | 65 |
| s9234p50 | 103 | 200 | 1 | 2 | 38 | 120 | 120 | 1 | 2 | 38 | 73 |
| s9234p50 | 144 | 200 | 1 | 6 | 56 | 98 | 120 | 1 | 6 | 46 | 65 |
| s9234p50 | 145 | 200 | 1 | 6 | 56 | 98 | 120 | 1 | 6 | 46 | 65 |
| s9234p50 | 146 | 200 | 1 | 6 | 56 | 98 | 120 | 1 | 6 | 46 | 65 |
| s9234p50 | 147 | 200 | 1 | 6 | 58 | 96 | 120 | 1 | 6 | 46 | 65 |
| s9234p50 | 148 | 200 | 1 | 6 | 58 | 97 | 120 | 1 | 6 | 46 | 65 |

Table 2 shows the results for the experiments with multiple error implementations. This time, the union of the sets of sites reported by the backtrace and X-analysis methods was used in order to filter candidates for the complementation method. Furthermore, the inventors experimented with varying the cutoff for choosing the top candidates, in terms of the top 10%, 25% and 50% of nets ordered by decreasing counts. The reason, as mentioned earlier, is that with multiple errors, each of the methods loses some accuracy, and the real error sites are likely not to have the largest counts. The description of the columns is identical to those in Table 1, except that Column 1 also indicates the cutoff percentage used for each circuit. For example, C1908p10 indicates that a 10% cutoff was used.

It is noted from Columns 4 and 9, that both approaches miss true error sites for some examples when the cutoff is 10%. However, for the present experiments, a 25% cutoff was adequate for catching the true error sites in all examples, except C1908, where we had to increase the cutoff to 50%. Note also that the number of reported error sites decreases for the combination approach, but not as markedly as for the single error implementations. Part of this can be explained by the observation that the number of candidates given as input to the complementation method (Columns 6 and 11) does not decrease significantly for the combination approach.

Upon investigating this further, we found that the X-analysis method was not very effective in that it was reporting a very large number of error sites. However, by dropping this method completely, some error sites would be missed even with 50% cutoff, since the backtrace method alone is not very accurate.

TABLE 3

Results for Multiple Error Implementations (with Intersection)

| | | Complementation Method Alone | | | | | Complementation Method in Combination | | | | |
|---|---|---|---|---|---|---|---|---|---|---|---|
| Name | Out# | Time(s) | #Match | #Err | #Cand | #Vec(K) | Time(s) | #Match | #Err | #Cand | #Vec(K) |
| c1908p10 | 15 | 201 | 0 | 1 | 496 | 5 | 120 | 0 | 0 | 46 | 32 |
| c1908p25 | 15 | 201 | 1 | 2 | 496 | 5 | 120 | 0 | 0 | 120 | 12 |
| c1908p50 | 15 | 201 | 1 | 4 | | | 121 | 0 | 0 | 244 | 6 |
| c3540p10 | 10 | 401 | 1 | 3 | 799 | 5 | 240 | 1 | 3 | 80 | 26 |
| c3540p10 | 18 | 404 | 1 | 7 | 2390 | 3 | 241 | 1 | 4 | 235 | 9 |
| c3540p10 | 19 | 400 | 1 | 9 | 2401 | 3 | 240 | 1 | 3 | 233 | 9 |
| c3540p25 | 10 | 400 | 1 | 3 | 799 | 5 | 241 | 1 | 3 | 198 | 11 |
| c3540p25 | 18 | 401 | 1 | 48 | 2390 | 3 | 240 | 1 | 7 | 551 | 4 |
| c3540p25 | 19 | 401 | 1 | 63 | 2401 | 3 | 241 | 1 | 4 | 496 | 5 |
| c3540p50 | 10 | 400 | 1 | 4 | 799 | 5 | 240 | 1 | 4 | 396 | 6 |
| c3540p50 | 18 | 401 | 1 | 48 | 2390 | 3 | 242 | 1 | 17 | 1013 | 3 |
| c3540p50 | 19 | 402 | 1 | 63 | 2401 | 3 | 241 | 1 | 7 | 850 | 3 |
| c7552p10 | 81 | 400 | 0 | 1 | 100 | 57 | 240 | 0 | 0 | 3 | 103 |
| c7552p25 | 81 | 400 | 1 | 2 | 100 | 57 | 240 | 0 | 0 | 4 | 99 |
| c7552p50 | 81 | 400 | 1 | 4 | 100 | 58 | 240 | 0 | 0 | 20 | 68 |
| s15850p10 | 141 | 304 | 2 | 11 | 1692 | 1 | 180 | 0 | 2 | 67 | 25 |
| s15850p10 | 142 | 304 | 1 | 14 | 1696 | 1 | 180 | 1 | 14 | 105 | 19 |
| s15850p10 | 162 | 300 | 1 | 9 | 9 | 216 | 180 | 1 | 9 | 9 | 130 |
| s15850p25 | 141 | 303 | 2 | 11 | 1692 | 1 | 181 | 0 | 2 | 441 | 2 |
| s15850p25 | 142 | 304 | 1 | 14 | 1696 | 1 | 180 | 1 | 14 | 392 | 3 |
| s15850p25 | 162 | 300 | 1 | 9 | 9 | 216 | 180 | 1 | 9 | 9 | 130 |
| s15850p50 | 141 | 303 | 2 | 18 | 1692 | 1 | 182 | 0 | 2 | 532 | 2 |
| s15850p50 | 142 | 304 | 1 | 14 | 1696 | 1 | 180 | 1 | 14 | 541 | 2 |
| s15850p50 | 162 | 300 | 1 | 9 | 9 | 216 | 18 | 1 | 9 | 9 | 130 |
| s38584p10 | 438 | 600 | 1 | 9 | 73 | 34 | 360 | 1 | 4 | 5 | 90 |
| s38584p10 | 933 | 600 | 1 | 9 | 80 | 26 | 360 | 1 | 4 | 5 | 90 |
| s38584p10 | 934 | 601 | 1 | 11 | 85 | 25 | 360 | 1 | 4 | 5 | 89 |
| s38584p10 | 982 | 600 | 0 | 5 | 215 | 14 | 360 | 1 | 4 | 5 | 88 |
| s38584p10 | 985 | 600 | 1 | 9 | 249 | 12 | 360 | 1 | 4 | 16 | 53 |
| s38584p10 | 986 | 600 | 0 | 6 | 68 | 36 | 360 | 0 | 6 | 68 | 21 |
| s38584p10 | 988 | 600 | 0 | 6 | 59 | 39 | 360 | 0 | 6 | 59 | 24 |
| s38584p10 | 989 | 600 | 0 | 6 | 68 | 36 | 360 | 0 | 6 | 68 | 21 |
| s38584p10 | 990 | 600 | 0 | 6 | 59 | 39 | 360 | 0 | -6 | 59 | 24 |
| s38584p25 | 438 | 600 | 1 | 9 | -73 | 34 | 360 | 1 | 4 | 5 | 90 |
| s38584p25 | 933 | 600 | 1 | 9 | 80 | 26 | 360 | 1 | 4 | 5 | 90 |
| s38584p25 | 934 | 600 | 1 | 11 | 85 | 25 | 360 | 1 | 4 | 12 | 65 |
| s38584p25 | 982 | 601 | 1 | 9 | 215 | 14 | 360 | 1 | 4 | 5 | 88 |
| s38584p25 | 985 | 601 | 1 | 12 | 249 | 12 | 360 | 1 | 6 | 39 | 31 |
| s38584p25 | 986 | 600 | 1 | 10 | 68 | 36 | 360 | 1 | 4 | 6 | 85 |
| s38584p25 | 988 | 600 | 1 | 10 | 59 | 40 | 360 | 1 | 4 | 6 | 85 |
| s38584p25 | 989 | 600 | 1 | 10 | 68 | 36 | 360 | 1 | 4 | 6 | 85 |
| s38584p25 | 990 | 600 | 1 | 10 | 59 | 40 | 360 | 1 | 4 | 6 | 85 |
| s38584p50 | 438 | 600 | 1 | 17 | 73 | 34 | 360 | 1 | 6 | 10 | 70 |
| s38584p50 | 933 | 600 | 1 | 18 | 80 | 26 | 360 | 1 | 7 | 12 | 63 |
| s38584p50 | 934 | 600 | 1 | 20 | 85 | 25 | 360 | 1 | 13 | 26 | 41 |
| s38584p50 | 982 | 600 | 1 | 16 | 215 | 14 | 360 | 1 | 7 | 12 | 62 |
| s38584p50 | 985 | 600 | 1 | 23 | 249 | 12 | 360 | 1 | 12 | 98 | 16 |
| s38584p50 | 986 | 600 | 1 | 19 | 68 | 36 | 360 | 1 | 10 | 17 | 52 |
| s38584p50 | 988 | 600 | 1 | 19 | 59 | 39 | 360 | 1 | 9 | 16 | 54 |
| s38584p50 | 989 | 600 | 1 | 19 | 68 | 36 | 360 | 1 | 10 | 17 | 52 |
| s38584p50 | 990 | 600 | 1 | 19 | 59 | 39 | 360 | 1 | 10 | 16 | 53 |
| s9234p10 | 103 | 200 | 1 | 2 | 38 | 122 | 120 | 1 | 2 | 8 | 161 |
| s9234p10 | 144 | 200 | 1 | 6 | 56 | 99 | 120 | 1 | 4 | 13 | 141 |
| s9234p10 | 145 | 200 | 1 | 6 | 56 | 100 | 120 | 1 | 4 | 11 | 150 |
| s9234p10 | 146 | 200 | 1 | 6 | 56 | 100 | 120 | 1 | 4 | 9 | 160 |
| s9234p10 | 147 | 200 | 1 | 6 | 58 | 97 | 120 | 1 | 4 | 5 | 178 |
| s9234p10 | 148 | 200 | 1 | 6 | 58 | 98 | 120 | 1 | 4 | 8 | 166 |
| s9234p25 | 103 | 200 | 1 | 2 | 38 | 121 | 120 | 1 | 2 | 8 | 161 |
| s9234p25 | 144 | 200 | 1 | 6 | 56 | 99 | 120 | 1 | 4 | 13 | 141 |
| s9234p25 | 145 | 200 | 1 | 6 | 56 | 99 | 120 | 1 | 4 | 11 | 149 |
| s9234p25 | 146 | 200 | 1 | 6 | 56 | 99 | 120 | 1 | 4 | 11 | 149 |
| s9234p25 | 147 | 200 | 1 | 6 | 58 | 97 | 120 | 1 | 4 | 10 | 152 |
| s9234p25 | 148 | 200 | 1 | 6 | 58. | 97 | 120 | 1 | 4 | 10 | 153 |
| s9234p50 | 103 | 200 | 1 | 2 | 38 | 120 | 120 | 1 | 2 | 8 | 161 |
| s9234p50 | 144 | 200 | 1 | 6 | 56 | 98 | 120 | 1 | 4 | 21 | 111 |
| s9234p50 | 145 | 200 | 1 | 6 | 56 | 98 | 120 | 1 | 4 | 21 | 111 |
| s9234p50 | 146 | 200 | 1 | 6 | 56 | 98 | 120 | 1 | 4 | 21 | 111 |
| s9234p50 | 147 | 200 | 1 | 6 | 58 | 96 | 120 | 1 | 4 | 22 | 107 |
| s9234p50 | 148 | 200 | 1 | 6 | 58 | 2697 | 120 | 1 | 4 | 22 | 109 |

In Table 3, results again shown for the multiple error implementations. This time, set intersection was used between sites reported by the backtrace and X-analysis methods to filter the candidates for the complementation method. Clearly, the true error sites are missed for many examples (Columns 4 and 9). However, it is noted that for cases where the true error sites are caught, there is again a marked decrease in the number of reported error sites by the combination approach (Column 5 vs. Column 10). Again, this provides evidence of the efficacy of the combination approach for decreasing the number of candidates for the complementation method (Column 6 vs. Column 11), thereby allowing simulation of an increased number of vectors (Column 7 vs. Column 12).

Additional advantages and modifications will readily occur to those skilled in the art. Therefore, the invention in its broader aspects is not limited to the specific details shown and described herein. Accordingly, various modifications may be made without departing from the spirit or scope of the general inventive concept as defined by the appended claims and their equivalents.

What is claimed is:

1. A method of diagnosing an error after a failed combinational verification of a Boolean expression of a circuit and a specification of said circuit, comprising the steps of:

generating a first set of potential error sites causing a nonequivalence of said Boolean expression and said specification using a first technique that operates quickly;

generating a second set of potential error sites, smaller in number than said first set of potential error sites, using a second technique that operates on the first set of potential error sites, where said second technique is slower than said first technique but more accurate; and proving that a specific potential error site, contained in said second set of potential error sites, is an actual error site.

2. The method of claim 1, wherein said first technique is a X-Based method.

3. The method of claim 1, wherein said first technique is a backtrace method.

4. The method of claim 1, wherein said first technique is a combination of a backtrace method and a X-based method.

5. The method of claim 1, wherein said second technique is a complementation method.

6. An improved backtrace method of diagnosing an error after a failed combinational verification of a circuit having sites containing logical gates, comprising the steps of:

generating and simulating a 32-bit vector;

reading the input and output of each gate of said logical gates and determining bits for which the input and the output of said particular gate are the same;

tagging said input by said bits of said vector;

performing a bit-wise OR of said tagged bits from each fanout at each gate to determine the contribution of each path connecting said logical gates.

7. An improved X-based analysis method of diagnosing an error after a failed combinational verification of a circuit having sites containing logical gates, comprising the steps of:

dividing 32-bit words, serving as input vectors, into upper halves and lower halves; storing a vector pair in identical bit positions within said upper and lower halves of a particular word, setting the upper and lower halves of said words as complements for a given input of said inputs, and setting the upper and lower halves of said words to be identical for other inputs of said inputs;

inputting said input vectors into said gate inputs and simulating all gates;

monitoring the gate outputs for each gate, going from the output of the circuit through to the inputs of the circuit, determining if the gate outputs are bit-wise the same as the gate inputs; and incrementing a count value for each gate according to the number of said bits that are different.

* * * * *